United States Patent
Bullock et al.

(10) Patent No.: US 9,011,633 B2
(45) Date of Patent: Apr. 21, 2015

(54) BROADBAND TECHNIQUES TO REDUCE THE EFFECTS OF IMPEDANCE MISMATCH IN PLASMA CHAMBERS

(75) Inventors: Scott R. Bullock, Vail, AZ (US); Aaron Radomski, Wyoming, NY (US); Brent Irvine, Fairport, NY (US)

(73) Assignee: MKS Instruments, Inc., Andover, MA (US)

(*) Notice: Subject to any disclaimer, the term of this patent is extended or adjusted under 35 U.S.C. 154(b) by 2310 days.

(21) Appl. No.: 11/164,303

(22) Filed: Nov. 17, 2005

(65) Prior Publication Data

US 2007/0107844 A1     May 17, 2007

(51) Int. Cl.
| | |
|---|---|
| *C23C 16/00* | (2006.01) |
| *C23F 1/00* | (2006.01) |
| *H01J 7/24* | (2006.01) |
| *H05B 31/26* | (2006.01) |
| *H01J 37/32* | (2006.01) |

(52) U.S. Cl.
CPC ....... *H01J 37/3299* (2013.01); *H01J 37/32082* (2013.01); *H01J 37/32155* (2013.01); *H01J 37/32174* (2013.01)

(58) Field of Classification Search
CPC ............... H01J 37/32137; H01J 37/32155
USPC ...................... 118/715, 722, 723 R
See application file for complete search history.

(56) References Cited

U.S. PATENT DOCUMENTS

| | | | | |
|---|---|---|---|---|
| 5,057,185 A | * | 10/1991 | Thomas et al. | 438/710 |
| 5,643,364 A | * | 7/1997 | Zhao et al. | 118/723 E |
| 6,027,601 A | * | 2/2000 | Hanawa | 156/345.28 |
| 6,252,354 B1 | | 6/2001 | Collins et al. | |
| 6,700,092 B2 | * | 3/2004 | Vona et al. | 219/121.54 |
| 6,920,312 B1 | * | 7/2005 | Benjamin | 455/69 |
| 6,937,668 B2 | * | 8/2005 | Sridharan et al. | 375/296 |
| 7,292,045 B2 | * | 11/2007 | Anwar et al. | 324/536 |
| 2002/0096257 A1 | * | 7/2002 | Wang et al. | 156/345.48 |
| 2006/0057854 A1 | * | 3/2006 | Setsuhara et al. | 438/710 |

FOREIGN PATENT DOCUMENTS

EP    0677221 A1    10/1995

* cited by examiner

*Primary Examiner* — Maureen Gramaglia
(74) *Attorney, Agent, or Firm* — Harness, Dickey & Pierce, P.L.C.

(57) ABSTRACT

A plasma generator system for reducing the effects of impedance mismatch. The system has a variable frequency source having an output for emitting an RF signal. A plasma chamber has an input for receiving the RF signal. The variable frequency source modulates at least one of the frequency and phase of the RF signal to improve the system tolerance of impedance mismatches between the output of the variable frequency source and the input of the plasma chamber.

41 Claims, 5 Drawing Sheets

BROADBAND TECHNIQUES TO REDUCE THE EFFECTS OF IMPEDANCE MISMATCH IN PLASMA CHAMBERS

FIELD OF THE INVENTION

The present invention relates to radio frequency power generators for plasma chambers and, more particularly, to radio frequency power generators that limit the effects of an impedance mismatch between the radio frequency generator and the plasma chamber.

BACKGROUND OF THE INVENTION

Radio frequency (RF) generators are used to drive plasma chambers for various applications such as etching, semiconductor fabrication, and flat panel displays. Industry specified frequencies for operating RF power generators include 2 MHz, 4 MHz, 8 MHz, 3.2 MHz, 13.56 MHz, 60 MHz, and 100 MHz.

Known RF generators use continuous wave (CW) single-tone narrow-band signals which fix an RF carrier frequency at a desired operating frequency. However, an input impedance of the plasma chamber as seen by the RF generator may change drastically during operation due to perturbations of the plasma. When the input impedance changes, a possibility exists for a mismatch between the input impedance of the plasma chamber and an output impedance of the RF generator. The mismatch may be so significant that reflected waves from the plasma chamber severely impact operation of the RF generator. Alternatively, the RF generator may be self-protected and designed to turn off or reduce its output power upon detecting the significant mismatch. Either of these responses by a self-protected RF generator may cause the plasma to extinguish, which is also undesirable.

BRIEF SUMMARY OF THE INVENTION

In accordance with the needs identified in the art, a plasma generator system is provided. The system has a variable frequency source having an output for emitting an RF signal. A plasma chamber has an input for receiving the RF signal. The variable frequency source modulates at least one of the frequency and phase of the RF signal to improve the system tolerance of impedance mismatches between the output of the variable frequency source and the input of the plasma chamber.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE INVENTION

The following description of the preferred embodiment(s) is merely exemplary in nature and is in no way intended to limit the invention, its application, or uses.

Figure 1:
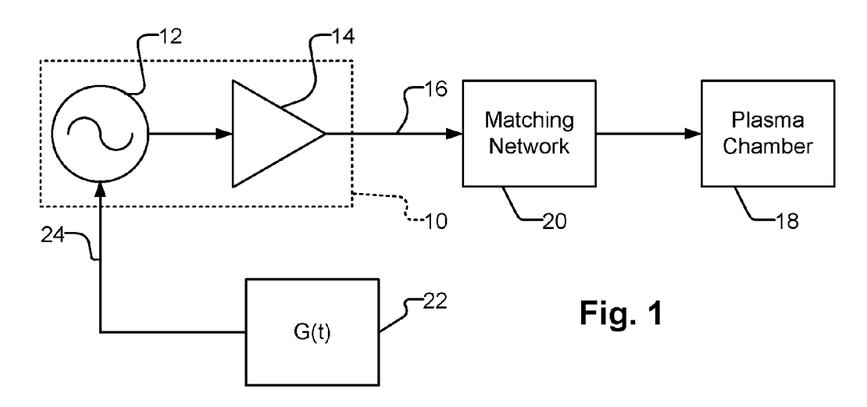
FIG. 1 depicts a block diagram of a generic plasma generator system having an open loop, FM mode, RF signal generation system.

FIG. 1 shows a generic plasma generator system having an open loop, FM mode, RF signal generation system. An RF generator 10 is shown generically as having a variable frequency oscillator (VFO) 12 and an RF amplifier 14. The RF generator 10 generates a power RF signal 16 for driving a plasma chamber 18 through a matching network 20. The matching network 20 matches an output impedance of the RF generator 10 to an input impedance of the plasma chamber 18. A modulation source 22 provides a modulating signal 24 to the RF generator 10 to modulate an output frequency of the power RF signal 16. The modulating signal 24 is generated according to a function G(t) which is selected as described later. The variable t preferably represents time.

In some embodiments, a significant impedance mismatch at a particular frequency will have a limited effect on the RF generator 10. Since the RF generator 10 provides FM RF energy, the amount of time spent at the particular frequency of the impedance mismatch will be minimized. This reduces the possibility of the reflected energy causing an undesirable effect on the RF power generator 10. Concurrently, the RF energy at the frequencies other than the particular frequency of the impedance mismatch should be sufficient to prevent the plasma from extinguishing in the plasma chamber 18.

Figure 2:
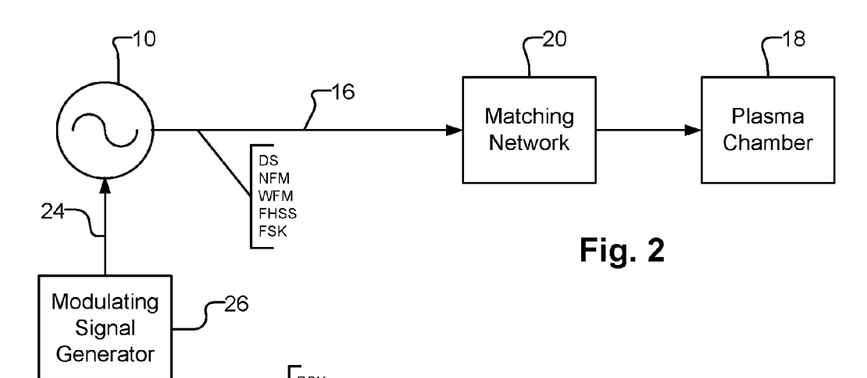
FIG. 2 depicts a block diagram of a plasma generator system having an open loop, analog FM mode, RF signal generation system.

FIG. 2 shows a plasma generator system having an open loop, analog FM mode, RF signal generation system. A modulating signal generator 26 produces the modulating signal 24. The modulating signal 24 is applied to the RF generator 10 and modulates the power RF signal 16 to an analog mode FM signal. Examples of analog mode FM signals include direct spread (DS) spectrum, narrow band FM (NFM), and wide band FM (WFM). The signal generator 24 produces the modulating signal 24 in accordance with the function G(t).

The system of FIG. 2 may also be used to generate the power RF signal 16 having a digital FM mode. A digital FM mode may be generated by using a function G(t) in the signal generator 26 to create a modulating signal 24 having square rising and falling edges. For example, when the modulating signal 24 is a staircase waveform, the resulting digital FM mode is frequency hopping spread spectrum (FHSS). In another example, when the modulating waveform 24 is a square waveform, the resulting digital FM mode is frequency shift keying (FSK).

The function G(t) may be determined experimentally and determines the wave shape, magnitude, and frequency of the modulating signal 24 produced by the modulation source 22 and the signal generator 26. The function G(t) should be chosen such that plasma generation in the plasma chamber 18 is sustained while limiting reflected RF to acceptable levels that do not significantly inhibit operation of the RF generator 10.

Figure 3:
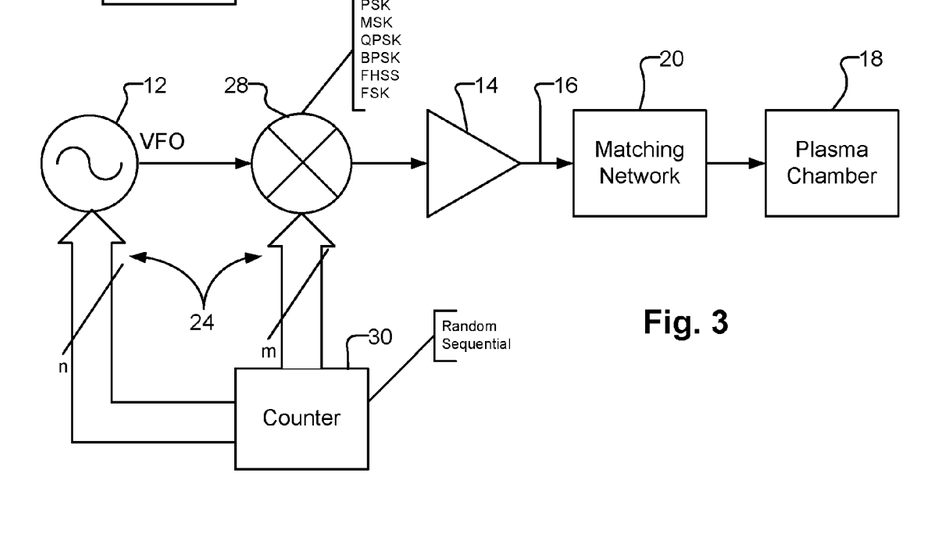
FIG. 3 depicts a block diagram of a plasma generator system having an open loop, digital FM mode, RF signal generation system.

FIG. 3 shows a plasma generator system having an open loop, digital FM mode, RF signal generation system. The VFO 12 provides an RF signal to a phase modulator 28. An output signal from the phase modulator 28 is amplified by the RF amplifier 14 and applied to the plasma chamber 18 through the matching network 20. A counter 30, which may count in a random or sequential pattern, provides a modulating signal 24 in the form of digital counts m-bits wide and n-bits wide, as shown. The variables n and m are positive integers. The n-bit count controls the VFO 12 to output one of $2^n$ distinct frequencies. The m-bit count controls the phase modulator to shift the output signal from the VFO 12 by one of $2^m$ phase values. In an alternative embodiment, the n-bit counter may be eliminated (n=0) which would have the effect of fixing the output frequency of the VFO 12.

The modulated signal from the phase modulator 28 is an RF signal having a broad frequency spectrum. The modulation modes than can be generated for operating the plasma chamber 18 include a phase shift keying (PSK) mode with n=0 and m=1, a two-bit quadrature phase shift keying (QPSK) mode with n=0 and m=2, a minimum phase shift keying (MSK) mode with n=0 and m=2, a frequency hopping spread spectrum (FHSS) mode with n>0 and m=0, and a frequency shift keying (FSK) mode with n=1 and m=0. QPSK modes of 4-bit and higher are achieved when the counter 30 has n-bits >0 and m-bits >2.

The values of n and m, as well as the count rate (counts per second) of the counter and the n-bit and m-bit counter step sizes may be determined experimentally. The selected values of n, m, count rates, and step sizes should be chosen such that at least two conditions are satisfied. The first condition to be satisfied is that plasma generation is sustained in the plasma chamber 18. The second condition to be satisfied is that the device providing RF power to the plasma chamber 18 does not receive a damaging level of reflected RF in the event the plasma chamber 18 creates an impedance mismatch at a particular frequency.

The bandwidth of the RF signal may also be controlled by using filters. For example, using MSK modulation with a symbol period/filter bandwidth product (Bt) of 0.5, over a 13.5-14 MHz spectrum modulated at 500 KHz, may produce satisfactory results. A frequency spectrum of 12.5-15 MHz modulated at 2.5 MHz may also produce satisfactory results.

Figure 4:
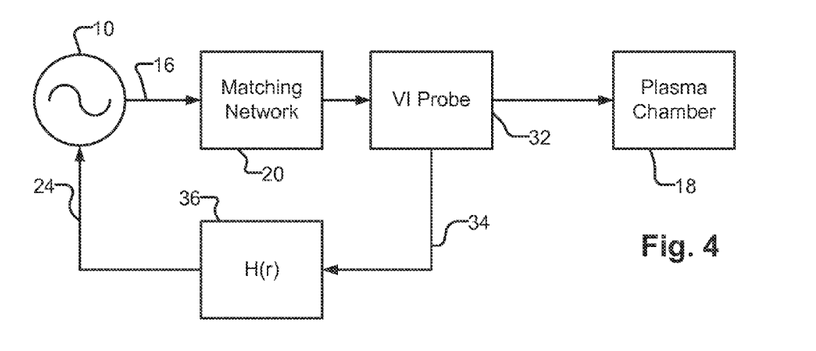
FIG. 4 depicts a block diagram of a generic plasma generator system having a closed loop, FM mode, RF signal generation system.

FIG. 4 shows a generic plasma generator system having a closed loop, FM mode, RF signal generation system. The RF generator 10 provides the FM RF signal 16 to the plasma chamber 18 through a matching network 20 and a reflected power meter 32. The reflected power meter 32 provides a measurement signal 34 indicative of the degree of RF coupling between an output of the matching network 12 and the input of the plasma chamber 18. The reflected power meter 32 may determine the degree of RF coupling using techniques known in the RF art, such as measuring the standing wave ratio (SWR) between the RF signal applied to the plasma chamber 18 and a reflected RF signal from the plasma chamber 18. The measurement signal 34 is applied to a feedback block 36 that implements a function H(r), where the variable r is preferably a magnitude of the measurement signal 34. The feedback block 36 generates a modulation signal 24 in accordance with the function H(r) and applies the modulation signal 24 to the RF generator 10. The RF generator 10 modulates a frequency and/or phase of the power RF signal 16 in accordance with the modulating signal 24.

Figure 5:
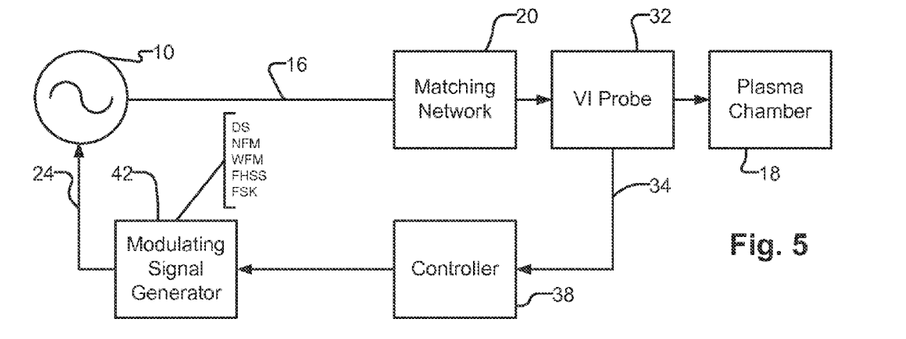
FIG. 5 depicts a block diagram of a plasma generator system having a closed loop, analog FM mode, RF signal generation system.

FIG. 5 depicts a plasma generator system having a closed loop, analog FM mode, RF signal generation system. The RF generator 10, the matching network 12, the reflected power meter 32, and the plasma chamber 18 operate as shown and described in FIG. 4. The reflected power meter 32 provides the measurement signal 34 to a controller 38. The controller 38 may be a PID type controller having any combination of P, I, and D terms such that it may also be one of a P, a PI, and a PD controller. A magnitude of each PID term may be selected experimentally to produce a stable system behavior. The controller 38 applies an output signal 40 to a modulating signal generator 42. The signal generator 42 uses the signal from the controller 38 to produce the modulating signal 24 which is applied to the RF generator 10. In alternate embodiments, the controller 38 may be implemented with a fuzzy logic controller or a neural network controller.

The modulating signal 24 is applied to the RF generator 10 such that it produces an RF signal modulated in an analog FM mode. Examples of such analog FM modes include DS, NFM, and WFM. As in FIG. 2, the modulating signal 24 may also have square rising and falling edges, thereby causing the RF generator 10 to produce a power RF signal 16 modulated in a digital FM mode such as FHSS and FSK.

The modulating signal generator 42 determines the wave shape, magnitude, and frequency of the modulating signal 24 in accordance with the output signal 40 from the controller 38. Accordingly, the function H(r) implemented in the signal generator 42 may be determined experimentally and determines the wave shape, magnitude, and frequency of the modulating signal 24 produced by the signal generator 42. The function H(r) should be chosen such that plasma generation in the plasma chamber 18 is sustained while limiting the reflected RF signal to an acceptable level that does not significantly inhibit operation of the RF generator 10.

Figure 6:
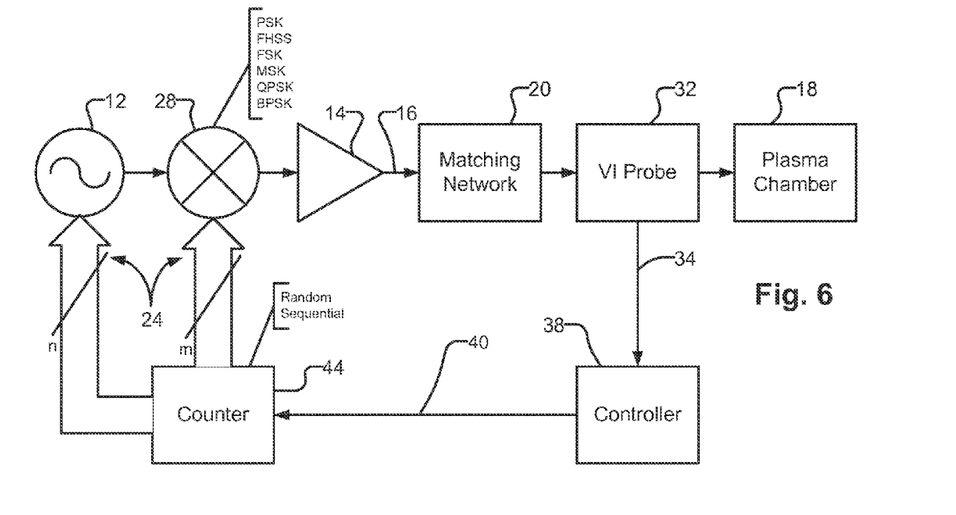
FIG. 6 depicts a block diagram of a plasma generator system having a closed loop, digital FM mode, RF signal generation system.

FIG. 6 depicts a plasma generator system having a closed loop, digital FM mode, RF signal generation system. The matching network 12, the reflected power meter 32, the controller 38, and the plasma chamber 18 operate as shown and described in FIG. 4. The output signal 40 from the controller 38 is applied to a counter 44. The counter 44, which may count in a random or sequential pattern, provides a modulating signal 24 in the form of digital counts m-bits wide and n-bits wide. The variables n and m are positive integers, and counting frequencies of the m-bit and n-bit counters are determined by the output signal from the controller 38. The n-bit count controls the VFO 12 to generate an RF signal having one of $2^n$ distinct frequencies. The m-bit count controls the phase modulator 28, which shifts the output signal from the VFO 12 by one of $2^m$ phase values. In an alternative embodiment, the n-bit counter may be eliminated (n=0) which has the effect of fixing the output frequency of the VFS 10.

The modulated signal from the phase modulator 28 is an RF signal having a broad frequency spectrum. The modulation modes than can be generated for the plasma chamber 18 include a phase shift keying (PSK) mode with n=0 and m=1, a two-bit quadrature phase shift keying (QPSK) mode with n=0 and m=2, a minimum phase shift keying (MSK) mode with n=0 and m=2, a frequency hopping spread spectrum (FHSS) mode with n>0 and m=0, and a frequency shift keying (FSK) mode with n=1 and m=0. QPSK modes of 4-bit and higher are achieved when the counter 44 has n-bits >0 and m-bits >2.

In some embodiments of the systems of FIGS. 5 and 6, the controller 38 holds the output signal 40 constant while the degree of RF coupling, as indicated by the measurement signal 34, is greater than a predetermined value. Holding the output signal 40 constant causes the RF generator 10, and the combination of the VFO 12 and phase modulator 28, to produce a CW RF signal. When a perturbation in the plasma causes the input impedance of the plasma chamber 18 to change, the degree of RF coupling will decrease. The decrease in the degree of RF coupling will be indicated by the measurement signal 34. If the RF coupling is less than the predetermined threshold, then the controller 38 resumes varying the output signal 40 in accordance with the measurement signal 34 and a control method executed by the controller 38.

Figure 7:
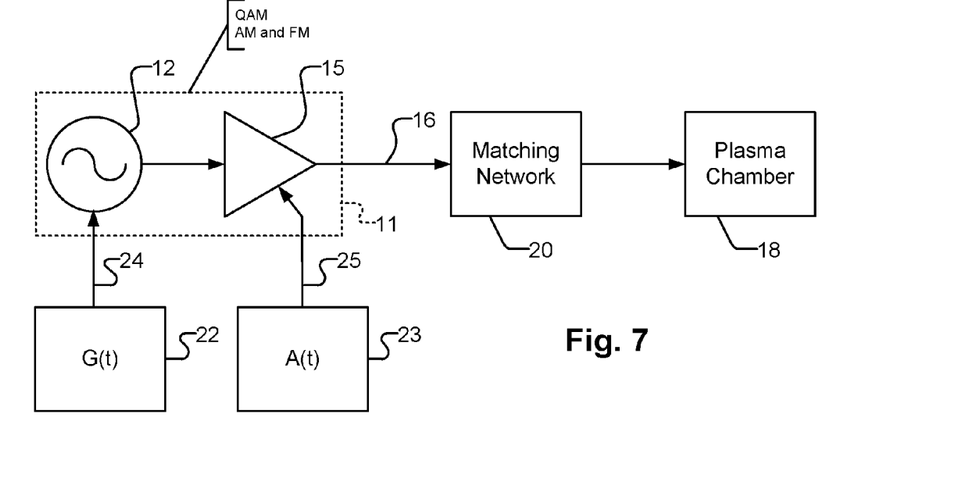
FIG. 7 depicts a block diagram of a generic plasma generator system having an open loop, AM/FM mode, RF signal generation system.

FIG. 7 shows a generic plasma generator system having an open loop, AM/FM mode, RF signal generation system. An RF generator 11 is shown generically having the variable frequency oscillator (VFO) 12 and a variable gain RF amplifier 15. The modulation source 22 provides the modulating signal 24 to the VFO 12 to modulate its output frequency. The modulating signal 24 is generated according to the function G(t). An amplitude modulating signal 25 is generated by an amplitude modulation source 23 according to a function A(t). The variable t preferably represents time. The variable gain RF amplifier 15 has a gain controlled by the amplitude modulating signal 25. The variable gain RF amplifier 15 receives the constant amplitude FM signal from the VFO 12 and amplifies the FM signal in accordance with the amplitude modulating signal 25. The variable gain RF amplifier 15 thereby generates a power RF signal 16 that is amplitude and frequency modulated (AM/FM). The functions G(t) and A(t) can also be chosen such that the power RF signal 16 is amplitude and phase modulated, such as quadrature amplitude modulation (QAM). The matching network 20 matches an output impedance of the RF generator 11 to the input impedance of the plasma chamber 18.

Figure 8:
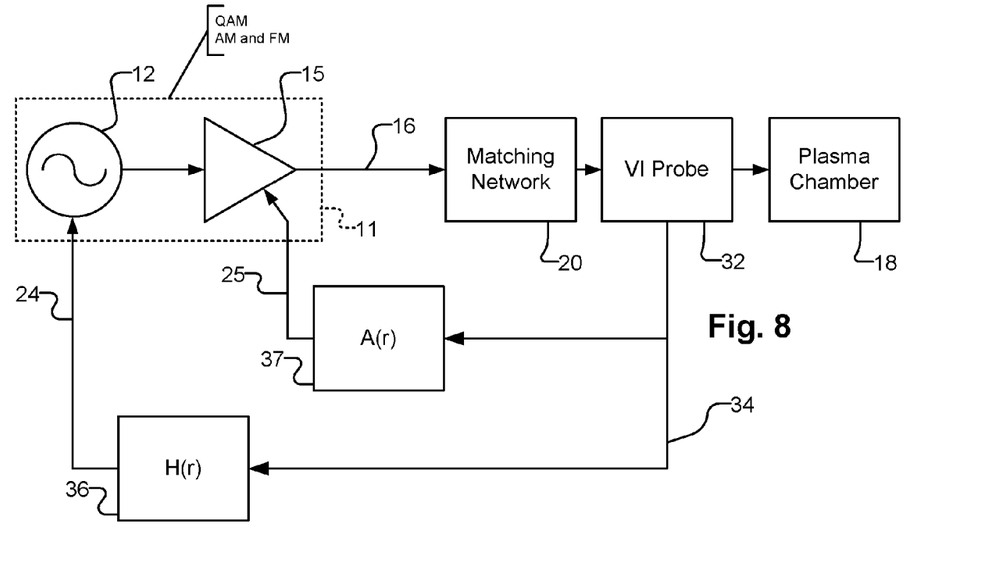
FIG. 8 depicts a block diagram of a generic plasma generator system having a closed loop, AM/FM mode, RF signal generation system.

FIG. 8 shows a generic plasma generator system having a closed loop, AM/FM mode, RF signal generation system. The RF generator 11 provides the AM/FM power RF signal 16 to the plasma chamber 18 through a matching network 20 and a reflected power meter 32. The reflected power meter 32 provides the measurement signal 34 indicative of the degree of RF coupling between the output of the matching network 20 and the input of the plasma chamber 18. The measurement signal 34 is applied to feedback blocks 36 and 37. The feedback block 36 controls the frequency of the VFO 24 as shown and described in FIG. 4. The feedback block 37 generates the amplitude modulation signal 25 in accordance with a function A(r) and applies the amplitude modulation signal 25 to the variable gain RF amplifier 15. The RF generator 11 thereby provides the AM/FM power RF signal 16 in accordance with the modulating signal 24 and the amplitude modulating signal 25. The functions G(r) and A(r) can also be chosen such that the power RF signal 16 is amplitude and phase modulated, such as QAM.

Figure 9:
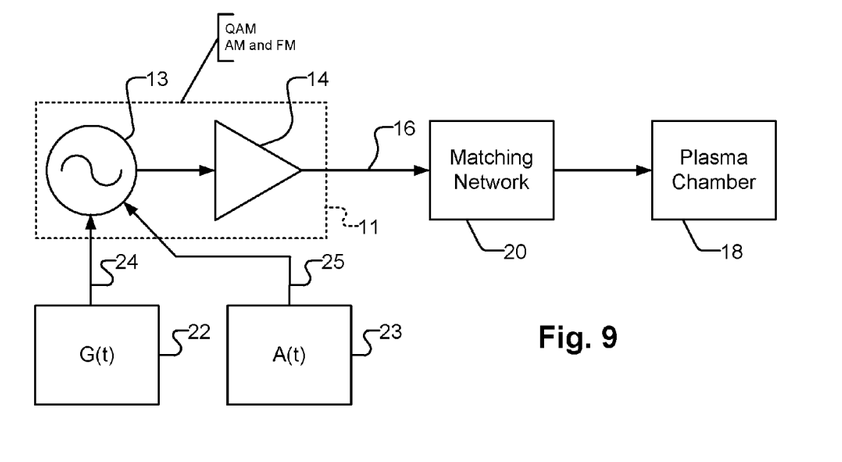
FIG. 9 depicts a block diagram of a generic plasma generator system having an open loop, AM/FM mode, RF signal generation system.
Figure 10:
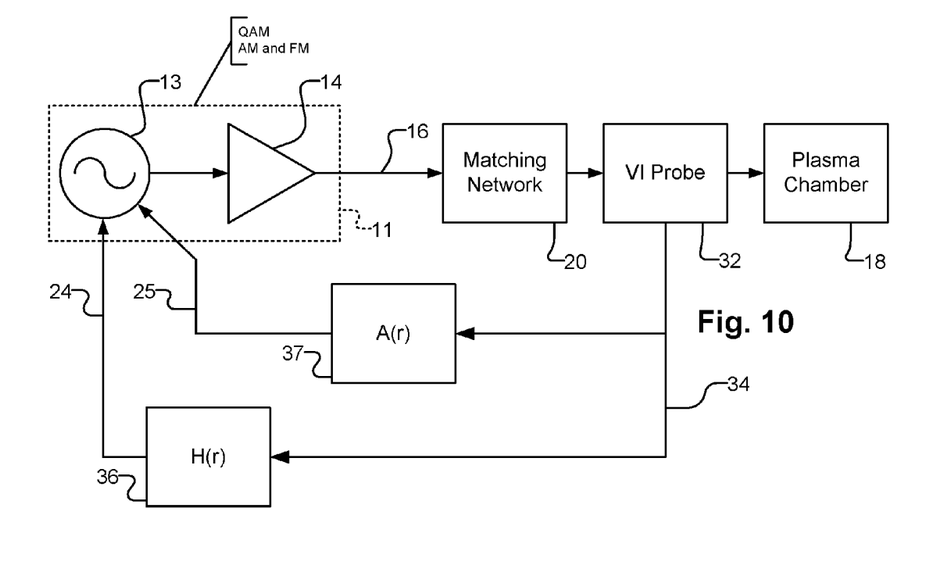
FIG. 10 depicts a block diagram of a generic plasma generator system having a closed loop, AM/FM mode, RF signal generation system.

FIGS. 9 and 10 show generic plasma generator systems that are similar, except for the architecture of the RF generator 11, to the systems of FIGS. 7 and 8, respectively. In FIGS. 9 and 10, the RF generator 11 has a VFO 13 with a variable output amplitude. The gain of the RF amplifier 14 is constant. The output amplitude of a VFO 13 is controlled by the amplitude modulation signal 25. The VFO 13 therefore applies an AM/FM signal to the RF amplifier 14, which provides the power RF signal 16. Selection of transformations A(t) and A(r) may also be accomplished in accordance with Vona, Jr. et al., U.S. Pat. No. 6,700,092, "Pulsing Intelligent RF Modulation Controller", Mar. 2, 2004, the specification of which is hereby incorporated by reference.

Figure 11:
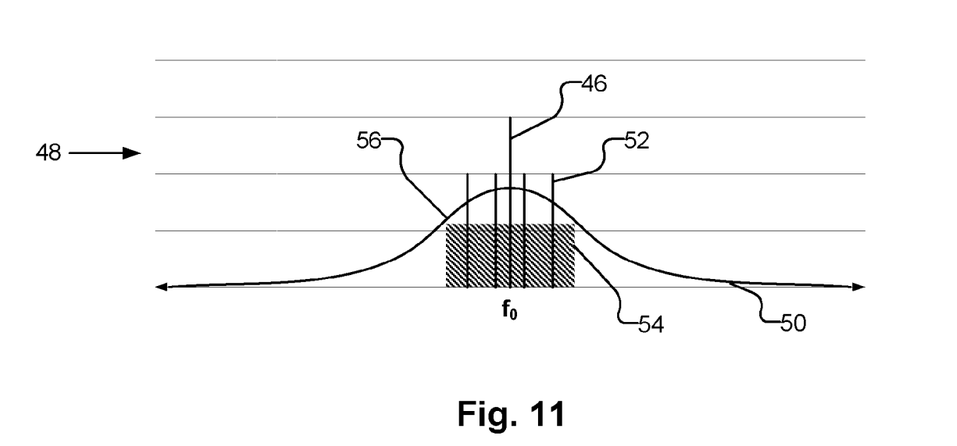
FIG. 11 depicts spectral diagrams of RF signals.

FIG. 11 depicts spectral diagrams of various FM signals and a spectrum diagram of a single-tone CW signal 46. A vertical axis 48 depicts energy of the frequency components of the RF signals. A horizontal axis 50 indicates the frequencies of the RF signal components with respect to a center frequency, $f_0$. The spectral diagrams are not to scale and actual spectrums will vary according to the RF signals that are applied to the plasma chamber 18. A spectrum of a four-frequency FHSS signal is represented by the four vertical lines 52. A spectrum of a DSS signal is represented by an area 54, and spectrums of other FM modes are represented by a curve 56.

Figure 12:
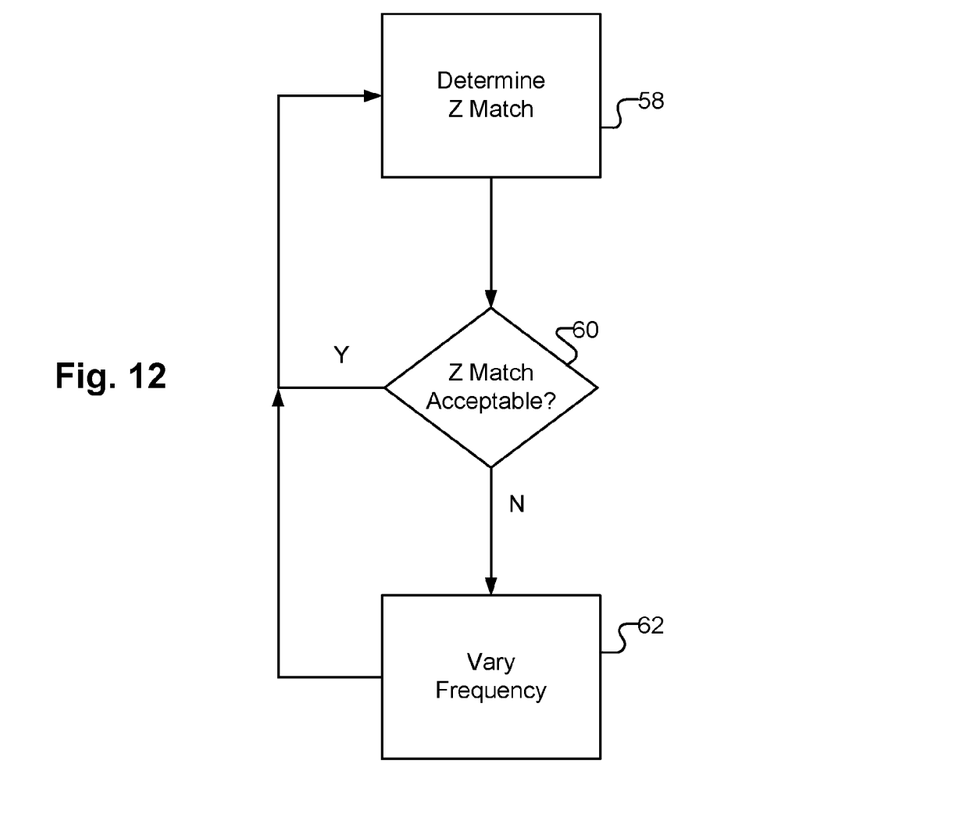
FIG. 12 depicts a flowchart of a method for generating an FM RF signal.

FIG. 12 depicts a method which may be used with the closed loop controllers 36, 38. The method may be operated continuously, such as by an analog controller, or executed periodically by a microcontroller that implements the controller. The method begins at block 58 and determines an impedance match between the matching network 20 and the plasma chamber 18. The impedance match is directly related to the degree of RF coupling and may therefore be determined from the measurement signal 34. From block 58 the method proceeds to a decision block 60 and determines whether the impedance match is acceptable. An acceptable impedance match may include one which couples sufficient RF power to the plasma chamber 18 to sustain plasma generation while reflected RF power from the plasma chamber 18 is at a low enough level such as not to damage the RF signal generation system. If the impedance match is acceptable then method returns to block 58 and continues to monitor the impedance match. Returning to decision block 60—if the impedance match is not acceptable then the method proceeds to block 62 and varies the frequency and/or phase of the RF signal in accordance with the selected FM mode.

The description of the invention is merely exemplary in nature and, thus, variations that do not depart from the gist of the invention are intended to be within the scope of the invention. Such variations are not to be regarded as a departure from the spirit and scope of the invention.

What is claimed as new and desired to be protected by Letters Patent of the United States is:

1. An RF generator system, comprising:
   a variable frequency source for generating a RF signal for application to a plasma chamber, the RF signal primarily having a particular frequency; and
   a modulation stage controlling the variable frequency source, the modulation stage configured to generate a signal to vary a frequency modulation of the RF signal, the modulation stage varying the frequency modulation of the RF signal during operation, to vary the energy applied to the plasma about the particular frequency, the modulation stage varying the frequency modulation of the RF signal to prevent an impedance mismatch, thereby preventing the plasma from extinguishing during operation; and a RF coupling detector having an output signal that varies in accordance with the RF coupling between the output of the variable frequency source and an input to the plasma chamber.

2. The system of claim 1 wherein the variable frequency source comprises a variable frequency oscillator having an output connected to an RF amplifier, the output of the RF amplifier generating the RF signal.

3. The system of claim 1 wherein the RF coupling detector determines the RF coupling in accordance with a standing wave ratio.

4. The system of claim 1 wherein the RF coupling detector determines the degree of RF coupling by comparing the RF signal generated by the variable frequency source to the RF energy from the plasma chamber.

5. The system of claim 1 wherein the frequency modulation includes one of direct spreading (DS), frequency hopping spread spectrum (FHSS), narrow band FM (NFM), and wide band FM (WFM).

6. The system of claim 1 wherein the variable frequency source includes a variable amplifier and the modulation stage that generates an amplitude modulation signal for modulating the amplitude of the RF signal.

7. The system of claim 6 wherein the frequency modulation and the amplitude modulation effect quadrature amplitude modulation (QAM) of the RF signal.

8. The system of claim 1 wherein the variable frequency source includes a phase controller, and the modulation stage generates a phase modulation signal for varying the phase modulation of the RF signal.

9. The system of claim 1 wherein the RF signal is modulated to generate a broadband energy applied to the plasma chamber.

10. The system of claim 1 wherein the modulation stage varies a phase modulation of the RF signal during operation, to vary the energy applied to the plasma about the particular frequency, the modulation stage varying the phase modulation of the RF signal to prevent an impedance mismatch, thereby preventing the plasma from extinguishing during operation.

11. The system of claim 10 wherein the frequency modulation or the phase modulation is MSK over a frequency spectrum from 13.5 MHz to 14 MHz with a 500 KHz modulation frequency.

12. The system of claim 10 wherein the frequency modulation or the phase modulation is MSK over a frequency spectrum from 12.5 MHz to 15 MHz with a 2.5 MHz modulation frequency.

13. The system of claim 10 wherein the RF signal ignites a plasma in the plasma chamber, wherein the frequency modulation or the phase modulation varies to sustain the plasma.

14. The system of claim 10 wherein the frequency modulation or phase modulation includes one of direct spreading (DS), frequency hopping spread spectrum (FHSS), narrow band FM (NFM), wide band FM (WFM), frequency shift keying (FSK), minimum shift keying (MSK), quadrature phase shift keying (QPSK), and binary phase shift keying (BPSK) of the RF signal.

15. An RF generator system, comprising:
a variable frequency source for generating a RF signal for application to a plasma chamber, the RF signal primarily operating at a particular frequency; and
a frequency modulation signal generator controlling the variable frequency source, the frequency modulation signal generator generating a frequency modulation signal, the frequency modulation signal causing the RF signal to frequency modulate at a frequency about the particular frequency, the frequency modulation signal generator varying the frequency modulation of the RF signal during operation to prevent an impedance mismatch, and thereby preventing the plasma from extinguishing during operation; and
a RF coupling detector that determines the RF coupling between an output of the variable frequency source and an input to the plasma chamber.

16. The system of claim 15 wherein the variable frequency source comprises a variable frequency oscillator having an output connected to an RF amplifier, the output of the RF amplifier generating the RF signal.

17. The system of claim 15 wherein the RF coupling detector determines the RF coupling in accordance with a standing wave ratio.

18. The system of claim 17 wherein the RF coupling detector determines the degree of RF coupling by comparing the RF signal generated by the variable frequency source to the RF energy from the plasma chamber.

19. The system of claim 7 wherein the frequency of the variable frequency source remains constant while the RF coupling with the plasma chamber is greater than a predetermined threshold.

20. The system of claim 17 wherein the magnitude of modulation increases as the RF coupling with the plasma chamber decreases.

21. The system of claim 17 wherein the period of modulation decreases as the RF coupling with the plasma chamber decreases.

22. The system of claim 15 wherein the frequency modulation signal generator selects from one of a predetermined number of frequencies about the particular frequency to cause the RF signal vary about the particular frequency.

23. The system of claim 15 wherein the frequency modulation signal generator causes the RF signal to have a frequency varying about the particular frequency so as to define an area about the particular frequency that maintains sufficient energy to sustain a plasma in the plasma chamber.

24. The system of claim 23 wherein the energy is a broadband energy about the particular frequency.

25. The system of claim 15 wherein the frequency modulation signal provides a frequency modulation mode of operation about the particular frequency.

26. The system of claim 15 wherein the variable frequency source includes a phase controller, and the frequency modulation signal generator generates a phase modulation signal for varying the phase of the RF signal.

27. The system of claim 15 wherein the frequency modulation signal generator varies a phase modulation of the RF signal during operation, to vary the energy applied to the plasma about the particular frequency, the frequency modulation signal generator varying the phase modulation of the RF signal to prevent an impedance mismatch, thereby preventing the plasma from extinguishing during operation.

28. The system of claim 27 wherein the frequency modulation or phase modulation includes one of direct spreading (DS), frequency hopping spread spectrum (FHSS), narrow band FM (NFM), wide band FM (WFM), frequency shift keying (FSK), minimum shift keying (MSK), quadrature phase shift keying (QPSK), and binary phase shift keying (BPSK) of the RF signal.

29. An RF generator system, comprising:
a variable frequency source for generating a RF signal for application to a plasma chamber, the RF signal primarily having a particular frequency;
a modulation module controlling the variable frequency source and configured to generate a signal to vary a frequency modulation of the RF signal, the modulation module varying the frequency modulation of the RF signal about the particular frequency during operation, the modulation module varying the frequency modulation of the RF signal to prevent an impedance mismatch and preventing the plasma from extinguishing; and a RF coupling detector having an output signal that varies in accordance with the RF coupling between an output of the variable frequency source and an input to the plasma chamber, wherein the frequency modulation spreads the energy of the RF signal about the particular frequency.

30. The system of claim 29 wherein the variable frequency source comprises a variable frequency oscillator having an output connected to an RF amplifier, the output of the RF amplifier generating the RF signal.

31. The system of claim 29 wherein the frequency modulation includes one of direct spreading (DS), frequency hopping spread spectrum (FHSS), narrow band FM (NFM), and wide band FM (WFM).

32. The system of claim 29 wherein the variable frequency source includes a variable amplifier and the modulation module generates an amplitude modulation signal for modulating the amplitude of the RF signal.

33. The system of claim 32 wherein the frequency modulation and the amplitude modulation effect quadrature amplitude modulation (QAM) of the RF signal.

34. The system of claim 29 wherein the RF signal is modulated to generate a broadband energy applied to the plasma chamber.

35. The system of claim 29 wherein the modulation module varies a phase modulation of the RF signal during operation, to vary the energy applied to the plasma about the particular frequency, the modulation module varying the phase modulation of the RF signal to prevent an impedance mismatch, thereby preventing the plasma from extinguishing during operation.

36. The system of claim 35 wherein the frequency modulation or the phase modulation is MSK over a frequency spectrum from 13.5 MHz to 14 MHz with a 500 KHz modulation frequency.

37. The system of claim 35 wherein the frequency modulation or the phase modulation is MSK over a frequency spectrum from 12.5 MHz to 15 MHz with a 2.5 MHz modulation frequency.

38. The system of claim 35 wherein the variable frequency source includes a phase controller, and the modulation module generates a phase modulation signal for varying the phase modulation of the RF signal.

39. The system of claim 38 wherein the frequency and phase of the variable frequency source remains constant while the RF coupling is greater than a predetermined threshold.

40. The system of claim 35 wherein the RF signal ignites a plasma in the plasma chamber, wherein the frequency modulation or the phase modulation varies to sustain the plasma.

41. The system of claim 35 wherein the frequency modulation or phase modulation includes one of direct spreading (DS), frequency hopping spread spectrum (FHSS), narrow band FM (NFM), wide band FM (WFM), frequency shift keying (FSK), minimum shift keying (MSK), quadrature phase shift keying (QPSK), and binary phase shift keying (BPSK) of the RF signal.

* * * * *

UNITED STATES PATENT AND TRADEMARK OFFICE
CERTIFICATE OF CORRECTION

| | | |
|---|---|---|
| PATENT NO. | : 9,011,633 B2 | Page 1 of 1 |
| APPLICATION NO. | : 11/164303 | |
| DATED | : April 21, 2015 | |
| INVENTOR(S) | : Scott R. Bullock et al. | |

It is certified that error appears in the above-identified patent and that said Letters Patent is hereby corrected as shown below:

Column 8,
Line 20, Claim 19, delete "7" and insert --17--.

Signed and Sealed this
Seventeenth Day of May, 2016

Michelle K. Lee
*Director of the United States Patent and Trademark Office*